US012796483B2

(12) United States Patent
Chang

(10) Patent No.: US 12,796,483 B2
(45) Date of Patent: Nov. 10, 2026

(54) IC PACKAGE STRUCTURE CAPABLE OF INCREASING ISOLATION BETWEEN INTERFERENCE SOURCES

(71) Applicant: REALTEK SEMICONDUCTOR CORPORATION, Hsinchu (TW)

(72) Inventor: Kai-Yen Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 365 days.

(21) Appl. No.: 18/430,689

(22) Filed: Feb. 2, 2024

(65) Prior Publication Data

US 2024/0266314 A1 Aug. 8, 2024

(30) Foreign Application Priority Data

Feb. 3, 2023 (TW) ................................ 112103893

(51) Int. Cl.
*H10W 70/40* (2026.01)
*H10W 90/00* (2026.01)

(52) U.S. Cl.
CPC ........ *H10W 70/421* (2026.01); *H10W 70/411* (2026.01); *H10W 90/754* (2026.01)

(58) Field of Classification Search
CPC ......... H10W 72/50-59; H10W 72/015-01571; H10W 72/075-07555; H10W 90/751-759
See application file for complete search history.

(56) References Cited

U.S. PATENT DOCUMENTS

| | | | | |
|---|---|---|---|---|
| 9,455,157 | B1 * | 9/2016 | Jain | H10W 44/20 |
| 2005/0088241 | A1 * | 4/2005 | Behzad | H10D 89/611 330/307 |
| 2013/0157594 | A1 * | 6/2013 | Taskov | B23K 31/02 455/84 |
| 2016/0099220 | A1 * | 4/2016 | Atesal | H10W 42/265 257/664 |
| 2017/0330824 | A1 * | 11/2017 | Tabata | H01F 38/14 |
| 2018/0167064 | A1 * | 6/2018 | Shapiro | H03K 17/693 |
| 2023/0036197 | A1 * | 2/2023 | Murdock | H10W 44/20 |

FOREIGN PATENT DOCUMENTS

| | | | | |
|---|---|---|---|---|
| KR | 20220053747 A | * | 5/2022 | H01L 24/38 |

* cited by examiner

*Primary Examiner* — Wael M Fahmy
*Assistant Examiner* — Quinton A Brasfield
(74) *Attorney, Agent, or Firm* — WPAT, PC

(57) ABSTRACT

An IC package structure includes a die, a die pad, a downbond wire, a lead frame, and bonding wires. The die includes: a first interference source and a second interference source being coupled with a first signal pad and a second signal pad respectively; and a first grounding pad and a second grounding pad being coupled together and positioned between the two interference sources. The die pad holds the die. The downbond wire couples the second grounding pad with the die pad's grounding terminal. The lead frame includes: a first lead; a second lead; and M grounding lead(s) positioned between the first and second leads. The bonding wires include: a first bonding wire coupling the first signal pad with the first lead; a second bonding wire coupling the second signal pad with the second lead; and N third bonding wire(s) coupling the first grounding pad with the M grounding lead(s).

18 Claims, 4 Drawing Sheets

100

IC PACKAGE STRUCTURE CAPABLE OF INCREASING ISOLATION BETWEEN INTERFERENCE SOURCES

BACKGROUND OF THE INVENTION

1. Field of the Invention

The present disclosure relates to an integrated circuit (IC) package, especially to an IC package structure capable of increasing isolation between interference sources.

2. Description of Related Art

When two radio-frequency (RF) signal transmitters are included in the same chip and are close to each other, the two RF signal transmitters may interfere with each other. Generally, the two RF signal transmitters are connected to their respective signal pads and therefrom connected to their respective signal leads through bonding wires. Although the above-mentioned package structure is simple, the isolation between the two RF signal transmitters is poor under the package structure.

SUMMARY OF THE INVENTION

An object of the present disclosure is to provide an integrated circuit (IC) package structure capable of increasing isolation between interference sources.

An embodiment of the IC package structure of the present disclosure includes a die, a die pad, at least one downbond wire, a lead frame, and bonding wires. The die includes: a first interference source (e.g., a first radio-frequency (RF) signal transmitter circuit); a first signal pad coupled to the first interference source; a second interference source (e.g., a second RF signal transmitter circuit); a second signal pad coupled to the second interference source; a first grounding pad; and a second grounding pad coupled to the first grounding pad, wherein both the two grounding pads are set between the first interference source and the second interference source. The die pad is used for holding the die. The at least one downbond wire couples the second grounding pad with at least one grounding terminal of the die pad. The lead frame includes: a first signal lead; a second signal lead; and M grounding lead(s) set between the first signal lead and the second signal lead, wherein the M is a positive integer. The bonding wires include a first bonding wire, a second bonding wire, and N third bonding wire(s), wherein the N is a positive integer. The first bonding wire couples the first signal pad with the first signal lead. The second bonding wire couples the second signal pad with the second signal lead. The N third bonding wire(s) couple(s) the first grounding pad with the M grounding lead(s). In virtue of the setting of the first grounding pad, the second grounding pad, the least one downbond wire, the M grounding lead(s), and the N third bonding wire(s), the isolation between the first interference source and the second interference source is improved.

Another embodiment of the IC package structure of the present disclosure includes a die, a die pad, a lead frame, and bonding wires. The die includes: a first interference source (e.g., a first RF signal transmitter circuit); a first signal pad coupled to the first interference source; a second interference source (e.g., a second RF signal transmitter circuit); a second signal pad coupled to the second interference source; and a grounding pad set between the first interference source and the second interference source. The die pad is used for holding the die. The lead frame includes: a first signal lead; a second signal lead; and M grounding lead(s) set between the first signal lead and the second signal lead, wherein the M is a positive integer. The bonding wires include a first bonding wire, a second bonding wire, and N third bonding wire(s), wherein the N is a positive integer. The first bonding wire couples the first signal pad with the first signal lead. The second bonding wire couples the second signal pad with the second signal lead. The N third bonding wire(s) couple(s) the grounding pad with the M grounding lead(s). In virtue of the setting of the grounding pad, the M grounding lead(s), and the N third bonding wire(s), the isolation between the first interference source and the second interference source is improved.

Another embodiment of the IC package structure of the present disclosure includes a die, a die pad, at least one downbond wire, a lead frame, and bonding wires. The die includes: a first interference source (e.g., a first RF signal transmitter circuit); a first signal pad coupled to the first interference source; a second interference source (e.g., a second RF signal transmitter circuit); a second signal pad coupled to the second interference source; a first grounding pad; and a second grounding pad, wherein both the two grounding pads are set between the first interference source and the second interference source. The die pad is used for holding the die. The at least one downbond wire couples the second grounding pad with at least one grounding terminal of the die pad. The lead frame includes: a first signal lead; a second signal lead; and M grounding lead(s) set between the first signal lead and the second signal lead, wherein the M is a positive integer. The bonding wires include a first bonding wire, a second bonding wire, and N third bonding wire(s), wherein the N is a positive integer. The first bonding wire couples the first signal pad with the first signal lead. The second bonding wire couples the second signal pad with the second signal lead. The N third bonding wire(s) couple(s) the first grounding pad with the M grounding lead(s). In virtue of the setting of the first grounding pad, the second grounding pad, the least one downbond wire, the M grounding lead(s), and the N third bonding wire(s), the isolation between the first interference source and the second interference source is improved.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses an integrated circuit (IC) package structure capable of increasing isolation between interference sources.

Figure 1:
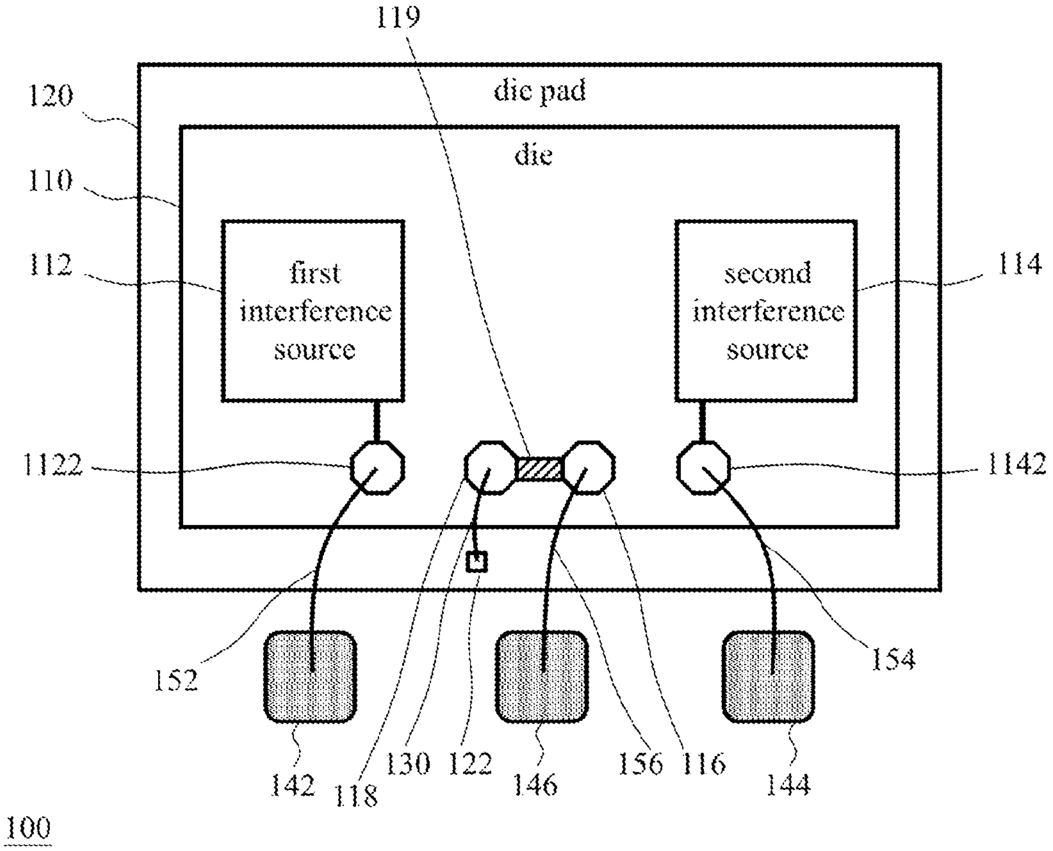
FIG. 1 shows an embodiment of the integrated circuit (IC) package structure of the present disclosure.

FIG. 1 shows an embodiment of the IC package structure of the present disclosure. The IC package structure 100 of FIG. 1 includes a die 110, a die pad 120, at least one downbond wire 130, a lead frame including multiple leads (i.e., the leads 142, 144, and 146 in FIG. 1), and bonding wires (i.e., bonding wires 152, 154, and 156 in FIG. 1). These components are described in the following paragraphs, respectively.

Referring to FIG. 1, the die 110 includes a first interference source 112, a first signal pad 1122, a second interference source 114, a second signal pad 1142, a first grounding pad 116, and a second grounding pad 118. The first interference source 112 could be a first radio-frequency (RF) signal transmitter circuit or any circuit generating a signal which substantially interferes with a signal of the second interference source 114. The first signal pad 1122 is coupled to the first interference source 112, and is used for outputting a signal of the first interference source 112 or receiving a signal for the first interference source 112. The first signal pad 1122 can optionally be deemed a part of the first interference source 112. The second interference source 114 is a second RF signal transmitter circuit or any circuit generating a signal which substantially interferes with a signal of the first interference source 112. It is noted that the frequency (e.g., 2.45 GHz) of an output signal of the second RF signal transmitter circuit is different from the frequency (e.g., 5.18 GHz) of an output signal of the first RF signal transmitter circuit and thus the harmonic waves of the two output signals of the two RF signal transmitter circuits may interfere with each other. The second signal pad 1142 is coupled to the second interference source 114, and is used for outputting a signal of the second interference source 114 or receiving a signal for the second interference source 114. The second signal pad 1142 can optionally be deemed a part of the second interference source 114. The first grounding pad 116 is set between the first interference source 112 and the second interference source 114; for example, the first grounding pad 116 is set between the first signal pad 1122 and the second signal pad 1142. The second grounding pad 118 is coupled to the first grounding pad 116 through a trace 119 or other known/self-developed connection means, and is set between the first interference source 112 and the second interference source 114; for example, the second grounding pad 118 is set between the first signal pad 1122 and the second signal pad 1142. It is noted that in the embodiment of FIG. 1, the first grounding pad 116 and the second grounding pad 118 are set on a virtual line (not shown) connected between the first signal pad 1122 and the second signal pad 1142 to ensure the effects of isolation; however, the implementation of the present invention is not limited to the above features.

Referring to FIG. 1, the die pad 120 is used for holding the die 110; in other words, the die 110 is set on the die pad 120. Since a die pad alone is common in the semiconductor field, its detail is omitted here.

Referring to FIG. 1, the at least one downbond wire 130 couples the second grounding pad 118 with at least one grounding terminal 122 of the die pad 120, wherein the electric potential of the at least one grounding terminal 122 is a grounding electric potential of the die pad 120. Since a downbond wire alone is common in the semiconductor field, its detail is omitted here.

Referring to FIG. 1, the lead frame includes a first signal lead 142, a second signal lead 144, and M grounding lead(s) 146, wherein the M is a positive integer. The first signal lead 142 is corresponding to the first signal pad 1122, and is used for outputting a signal of the first interference source 112 or receiving a signal for the first interference source 112. The second signal lead 144 is corresponding to the second signal pad 1142, and is used for outputting a signal of the second interference source 114 or receiving a signal for the second interference source 114. The M grounding lead(s) 146 is/are corresponding to the first grounding pad 116, and is/are set between the first signal lead 142 and the second signal lead 144. The electric potential of the M grounding lead(s) 146 is a grounding electric potential of an external circuit (e.g., a printed circuit board (PCB)) which may be different from the grounding electric potential of the die pad 120 in utilization and/or electric functions. It is noted that in the embodiment of FIG. 1, the M grounding lead(s) 146 is/are set on a virtual line (not shown) connected between the first signal lead 142 and the second signal lead 144 to ensure the effects of isolation; however, the implementation of the present invention is not limited to the above features.

Referring to FIG. 1, the bonding wires include a first bonding wire 152, a second bonding wire 154, and N third bonding wire(s) 156, wherein the N is a positive integer. The first bonding wire 152 couples the first signal pad 1122 with the first signal lead 142. The second bonding wire 154 couples the second signal pad 1142 with the second signal lead 144. The N third bonding wire(s) 156 couple(s) the first grounding pad 116 with the M grounding lead(s) 146.

Referring to FIG. 1, in virtue of the setting of the first grounding pad 116, the second grounding pad 118, the least one downbond wire 130, the M grounding lead(s) 146, and the N third bonding wire(s) 156, the isolation between the first interference source 112 and the second interference source 114 is improved.

Figure 2:
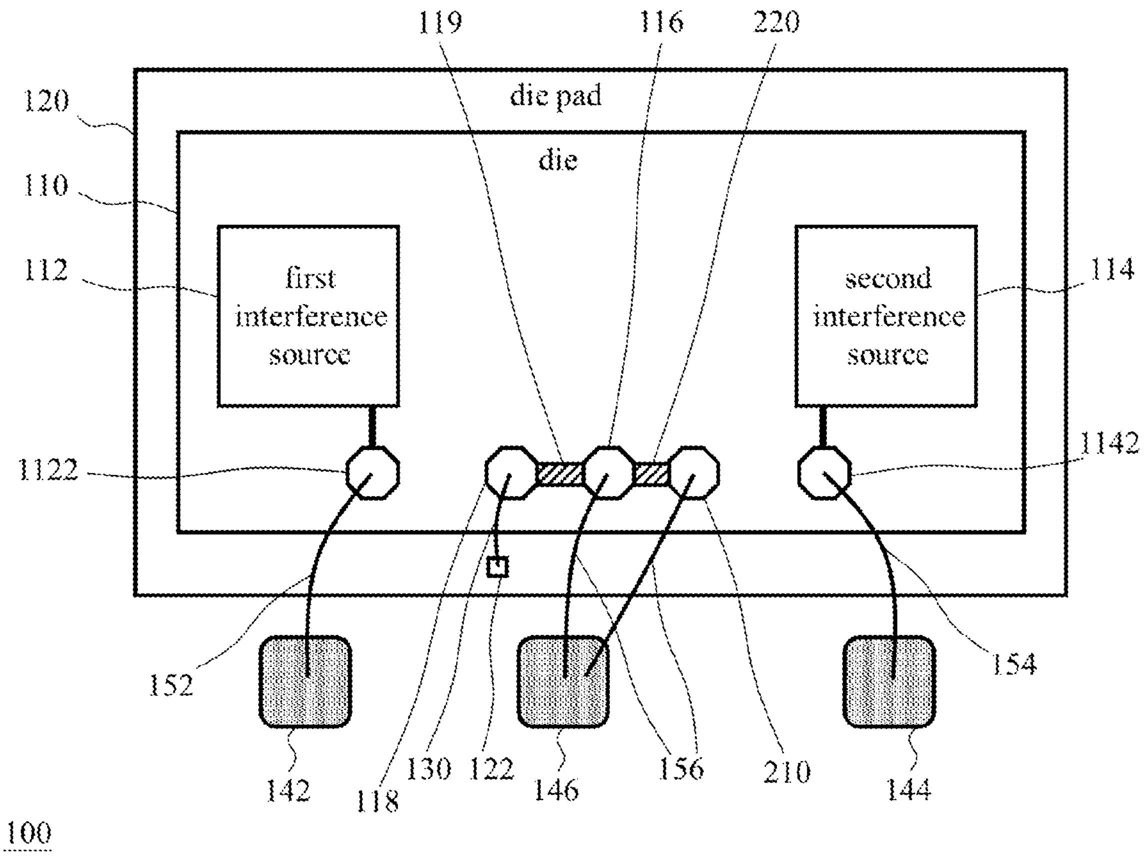
FIG. 2 shows a modification of the embodiment of FIG. 1.

FIG. 2 shows a modification of the embodiment of FIG. 1. In comparison with FIG. 1, the embodiment of FIG. 2 further includes K grounding pad(s) 210 set between the first interference source 112 and the second interference source 114, wherein the K is a positive integer. The K grounding pad(s) 210 is coupled to at least one of first grounding pad 116 and the second grounding pad 118 through at least one trace 220 or other known/self-developed connection means. The K grounding pad(s) 210 is coupled to at least a part of the M grounding lead(s) 146 through at least a part of the N third bonding wire(s) 156 or other bonding wires. When the K is greater than one, the K grounding pad(s) 210 can be coupled together through at least one trace (not shown) or other known/self-developed connection means. In virtue of the K grounding pad(s) 210 and the connection thereto, the isolation between the first interference source 112 and the second interference source 114 is further improved. Since those having ordinary skill in the art can refer to the embodiment of FIG. 1 to appreciate the detail and the modification of the embodiment of FIG. 2, repeated and redundant description is omitted here.

Figure 3:
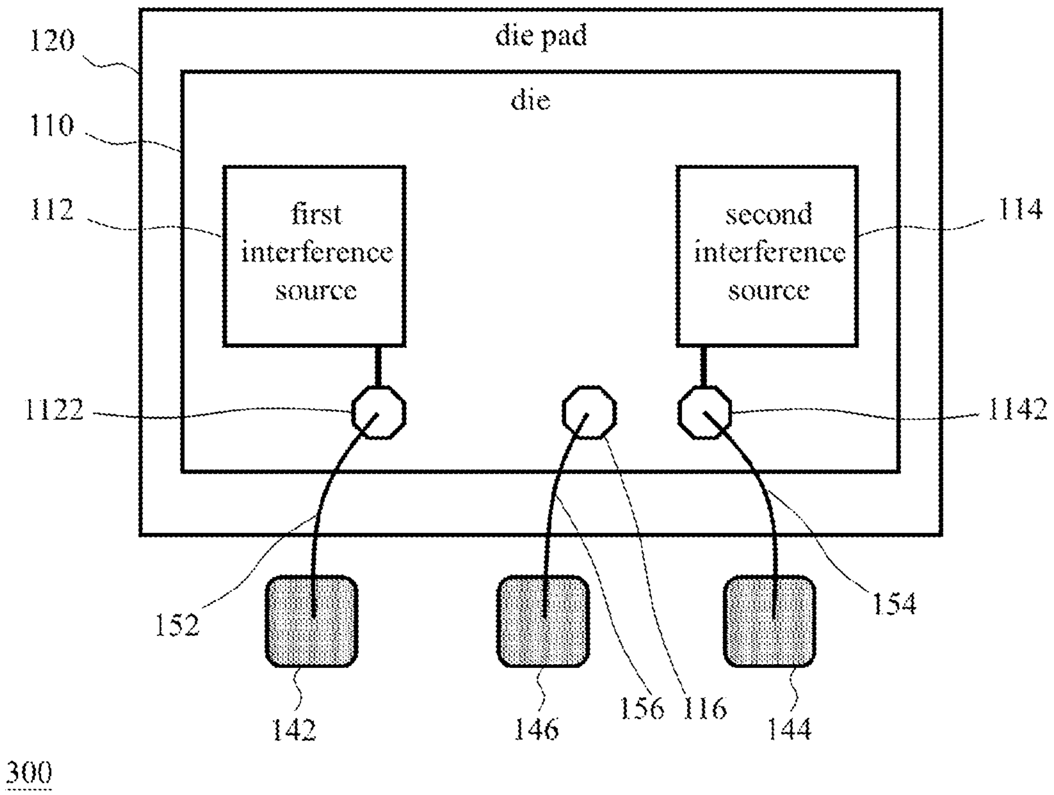
FIG. 3 shows another embodiment of the IC package structure of the present disclosure.

FIG. 3 shows another embodiment of the IC package structure of the present disclosure. In comparison with the IC package structure 100 of FIG. 1, the IC package structure 300 of FIG. 3 does not include the second grounding pad 118, the trace 119, and the at least one downbond wire 130. Since those having ordinary skill in the art can refer to the embodiment of FIG. 1 to appreciate the detail and the modification of the embodiment of FIG. 3, repeated and redundant description is omitted here.

Figure 4:
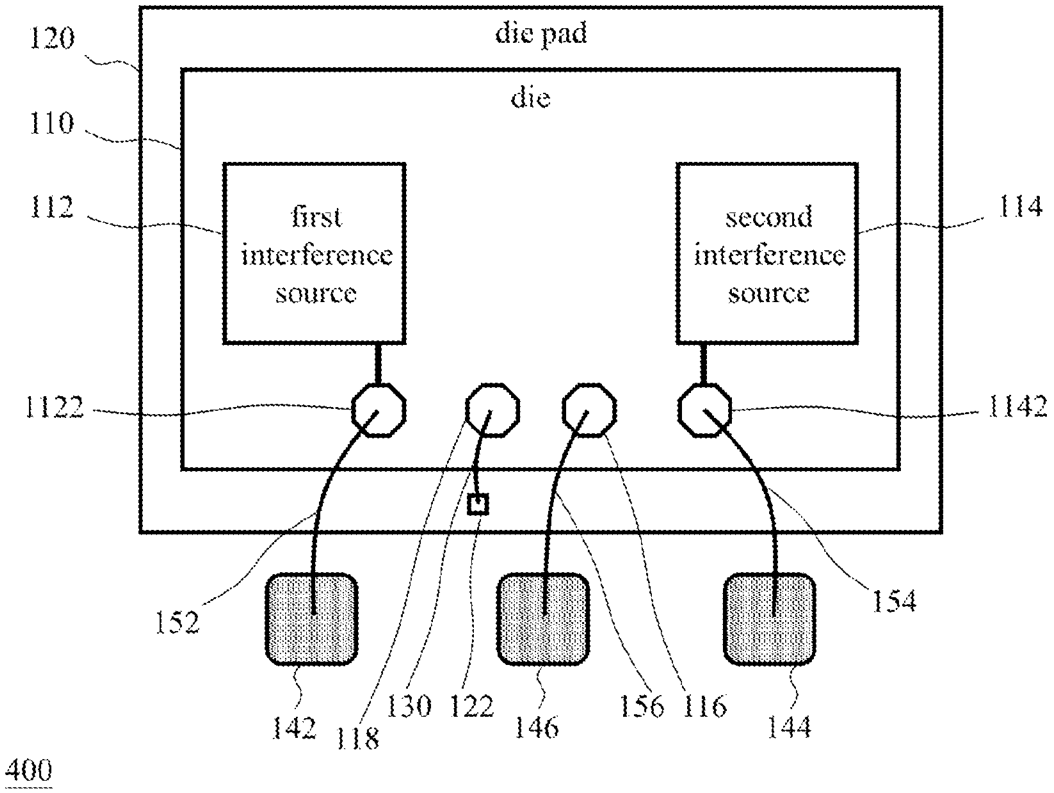
FIG. 4 shows yet another embodiment of the IC package structure of the present disclosure.

FIG. 4 shows another embodiment of the IC package structure of the present disclosure. In comparison with the IC package structure 100 of FIG. 1, the second grounding pad 118 is not coupled to the first grounding pad 116 in the IC package structure 400 of FIG. 4. Since those having ordinary skill in the art can refer to the embodiment of FIG.

1 to appreciate the detail and the modification of the embodiment of FIG. 4, repeated and redundant description is omitted here.

It is noted that the shape and the size of each component in FIGS. 1-4 are for illustrative purposes only, not for restriction on the implementation of the present invention. It is also noted that those having ordinary skill in the art can selectively use some or all of the features of any embodiment in this specification or selectively use some or all of the features of multiple embodiments in this specification to implement the present invention as long as such implementation is practicable; in other words, the way to implement the present invention is flexible based on the present disclosure.

To sum up, the IC package structure of the present disclosure can effectively increase isolation between interference sources in an uncomplicated manner.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An integrated circuit (IC) package structure capable of increasing isolation between interference sources, the IC package structure comprising a die, a die pad, at least one downbond wire, a lead frame, and bonding wires, wherein:
  the die includes:
    a first interference source;
    a first signal pad coupled to the first interference source;
    a second interference source;
    a second signal pad coupled to the second interference source;
    a first grounding pad set between the first interference source and the second interference source; and
    a second grounding pad coupled to the first grounding pad and set between the first interference source and the second interference source;
  the die pad is used for holding the die;
  the at least one downbond wire couples the second grounding pad with at least one grounding terminal of the die pad;
  the lead frame includes:
    a first signal lead;
    a second signal lead; and
    M grounding lead(s) set between the first signal lead and the second signal lead, wherein the M is a positive integer; and
  the bonding wires include:
    a first bonding wire coupling the first signal pad with the first signal lead;
    a second bonding wire coupling the second signal pad with the second signal lead; and
    N third bonding wire(s) coupling the first grounding pad with the M grounding lead(s), wherein the N is a positive integer.

2. The IC package structure of claim 1, wherein the die further includes: K grounding pad(s) set between the first interference source and the second interference source and coupled to at least one of the M grounding lead(s), wherein the K is a positive integer.

3. The IC package structure of claim 2, wherein the K grounding pad(s) is/are coupled to at least one of the first grounding pad and the second grounding pad through at least one trace.

4. The IC package structure of claim 2, wherein the K grounding pad(s) is/are coupled to at least a part of the M grounding lead(s) through at least a part of the N third bonding wire(s).

5. The IC package structure of claim 1, wherein the first interference source and the second interference source are a first radio-frequency (RF) signal transmitter circuit and a second RF signal transmitter circuit.

6. The IC package structure of claim 5, wherein a first frequency of a first output signal of the first RF signal transmitter circuit is different from a second frequency of a second output signal of the second RF signal transmitter circuit.

7. An integrated circuit (IC) package structure capable of increasing isolation between interference sources, the IC package structure comprising a die, a die pad, a lead frame, and bonding wires, wherein:
  the die includes:
    a first interference source;
    a first signal pad coupled to the first interference source;
    a second interference source;
    a second signal pad coupled to the second interference source; and
    a grounding pad set between the first interference source and the second interference source;
  the die pad is used for holding the die;
  the lead frame includes:
    a first signal lead;
    a second signal lead; and
    M grounding lead(s) set between the first signal lead and the second signal lead, wherein the M is a positive integer; and
  the bonding wires include:
    a first bonding wire coupling the first signal pad with the first signal lead;
    a second bonding wire coupling the second signal pad with the second signal lead; and
    N third bonding wire(s) coupling the grounding pad with the M grounding lead(s), wherein the N is a positive integer.

8. The IC package structure of claim 7, wherein the die further includes: K grounding pad(s) set between the first interference source and the second interference source and coupled to at least one of the M grounding lead(s), wherein the K is a positive integer.

9. The IC package structure of claim 8, wherein the K grounding pad(s) is/are coupled to the grounding pad through at least one trace.

10. The IC package structure of claim 8, wherein the K grounding pad(s) is/are coupled to at least a part of the M grounding lead(s) through at least a part of the N third bonding wire(s).

11. The IC package structure of claim 7, wherein the first interference source and the second interference source are a first radio-frequency (RF) signal transmitter circuit and a second RF signal transmitter circuit.

12. The IC package structure of claim 11, wherein a first frequency of a first output signal of the first RF signal transmitter circuit is different from a second frequency of a second output signal of the second RF signal transmitter circuit.

13. An integrated circuit (IC) package structure capable of increasing isolation between interference sources, the IC package structure comprising a die, a die pad, at least one downbond wire, a lead frame, and bonding wires, wherein:

the die includes:

a first interference source;

a first signal pad coupled to the first interference source;

a second interference source;

a second signal pad coupled to the second interference source;

a first grounding pad set between the first interference source and the second interference source; and a second grounding pad set between the first interference source and the second interference source;

the die pad is used for holding the die;

the at least one downbond wire couples the second grounding pad with at least one grounding terminal of the die pad;

the lead frame includes:

a first signal lead;

a second signal lead; and

M grounding lead(s) set between the first signal lead and the second signal lead, wherein the M is a positive integer; and the bonding wires include:

a first bonding wire coupling the first signal pad with the first signal lead;

a second bonding wire coupling the second signal pad with the second signal lead; and N third bonding wire(s) coupling the first grounding pad with the M grounding lead(s), wherein the N is a positive integer.

14. The IC package structure of claim 13, wherein the die further includes: K grounding pad(s) set between the first interference source and the second interference source and coupled to at least one of the M grounding lead(s), wherein the K is a positive integer.

15. The IC package structure of claim 14, wherein the K grounding pad(s) is/are coupled to the first grounding pad through at least one trace.

16. The IC package structure of claim 14, wherein the K grounding pad(s) is/are coupled to at least a part of the M grounding lead(s) through at least a part of the N third bonding wire(s).

17. The IC package structure of claim 13, wherein the first interference source and the second interference source are a first radio-frequency (RF) signal transmitter circuit and a second RF signal transmitter circuit.

18. The IC package structure of claim 17, wherein a first frequency of a first output signal of the first RF signal transmitter circuit is different from a second frequency of a second output signal of the second RF signal transmitter circuit.

* * * * *